United States Patent

Saito et al.

Patent Number: 5,085,946
Date of Patent: Feb. 4, 1992

[54] ELECTROLUMINESCENCE DEVICE

[75] Inventors: Shogo Saito, Fukuoka; Tetsuo Tsutsui, Kasuga; Chihaya Adachi, Oonojyo, all of Japan

[73] Assignee: Ricoh Company, Ltd., Tokyo, Japan

[21] Appl. No.: 457,839

[22] Filed: Dec. 27, 1989

[30] Foreign Application Priority Data

| Jan. 13, 1989 | [JP] | Japan | 1-007088 |
| Jan. 13, 1989 | [JP] | Japan | 1-007090 |
| Feb. 22, 1989 | [JP] | Japan | 1-42757 |
| Jun. 5, 1989 | [JP] | Japan | 1-142652 |
| Jun. 5, 1989 | [JP] | Japan | 1-142655 |

[51] Int. Cl.$^5$ ................................. H01J 1/62
[52] U.S. Cl. ................... 428/690; 313/504; 313/507; 428/917
[58] Field of Search ............. 428/690, 917; 313/504, 313/507

[56] References Cited

U.S. PATENT DOCUMENTS

| 4,720,432 | 1/1988 | Van Slyke et al. | 428/917 |
| 4,769,242 | 9/1988 | Tang et al. | 428/917 |
| 4,885,211 | 12/1989 | Tang et al. | 428/917 |

*Primary Examiner*—James J. Seidleck
*Attorney, Agent, or Firm*—Oblon, Spivak, McClelland, Maier & Neustadt

[57] ABSTRACT

An electroluminesence device comprising an organic compound having positive-hole-transporting property and a fluorescent organic compound having electron-transporting property in its luminescence layer interposed between a pair of electrodes. When the electroluminescence device comprises a cyclopentadiene derivative having formula (I) as the fluorescent organic compound, the device can emit blue light which has not been attained so far:

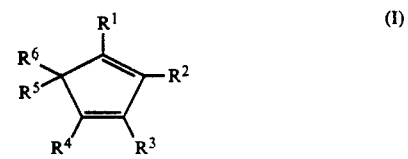

(I)

wherein $R^1$, $R^2$, $R^3$, $R^4$, $R^5$ and $R^6$ each independently represent hydrogen, an alkyl group having 1 to 10 carbon atoms, which may have a substituent, an alicyclic group having 5 to 6 carbon atoms, an alkoxyl group having 1 to 6 carbon atoms, which may have a substituent, a halogen, an acyl group, a hydroxyl group, an aryloxy group, an aryl group which may have a substituent, an allyl group, or an aldehyde group.

26 Claims, 1 Drawing Sheet

ELECTROLUMINESCENCE DEVICE

BACKGROUND OF THE INVENTION

1. Field of the Invention

This invention relates to an electroluminescence device comprising a luminescence layer comprising (i) an organic compound having positive-hole-transporting property and (ii) a fluorescent organic compound, capable of directly converting electric energy to photo-energy under application of a voltage thereto, and providing a light emitting device having a luminescent plane surface larger than those of an incandescent lamp, a fluorescent lamp or a light emitting diode.

2. Discussion of Background

Electroluminescence devices are classified into two types depending on the exciting mechanism for the emission: (1) an intrinsic electroluminescence device, in which electrons and positive holes migrate locally in the luminescence layer to excite a luminescent material contained therein, capable of emitting light only in an alternating electric field, and (2) a carrier injection type electroluminescence device, in which electrons and positive holes are injected by electrodes and recombined with each other in the luminescence layer to excite a luminescent material, capable of emitting light only in a direct electric field.

In general, the intrinsic electroluminescence device contains a luminescent material made of an inorganic compound such as ZnS to which Mn or Cu is added. The electroluminescence device of this type has the drawback that a high alternating electromotive force of 200 V or more is required for the operation thereof. In addition, this device is disadvantageous in that it requires high production cost, emits light with low luminous intensity, and has low durability.

On the other hand, the carrier injection type electroluminescence device has a luminescence layer made of a thin layer of an organic compound and can emit light with high luminous intensity. For instance, electroluminescence devices which emit green light are disclosed in Japanese Laid-Open Patent Application 59-194393 and U.S. Pat. No. 4,720,432, and an electroluminescence device which emits yellow light is reported in Jpn. Journal of Applied Physics, Vol. 27, Pages 713-715. One or both sides of the luminescence layer of each of the above electroluminescence devices, there is provided with a positive hole injection layer or an electron injection layer. These electro-luminescence devices can emit light with high luminous intensity in a direct electric field even when a low electromotive force of 100 V or less is applied thereto.

However, the carrier injection type electroluminescence device is composed of multiple thin layers made of organic compounds, and these layers are required to be as thin as 1000 Å to 3000 Å, uniform and free from pin holes. Therefore, not all organic compounds are usable for the electroluminescence device of this type. In addition, the production process of the carrier injection type electro-luminescence device is complicated because the multiple layers of the organic compounds are formed by vacuum deposition.

Furthermore, a carrier injection type electroluminescence device which can emit light with high luminous intensity and is highly durable has not been obtained yet. In particular, there is no electroluminescence device capable of emitting blue light as yet.

SUMMARY OF THE INVENTION

Accordingly, a first object of the present invention is to provide an electroluminescence device which can be readily produced, can emit light with high luminous intensity, and can maintain the light-emitting characteristics for a prolonged period of time.

A second object of the present invention is to provide an electroluminescence device which can be readily produced, can emit blue light with high luminous intensity, and can maintain the light-emitting characteristics for a prolonged period of time.

The first object of the present invention can be attained by an electroluminescence device comprising a substrate, a first electrode formed on the substrate, a luminescense layer formed on the first electrode, comprising an organic compound having positive-hole-transporting property and a fluorescent organic compound having electron-transporting property, and a second electrode formed on the luminescence layer.

The second object of the present invention can be attained by the above-described electroluminescence device, in which the fluorescent organic compound is a cyclopentadiene derivative having formula (I):

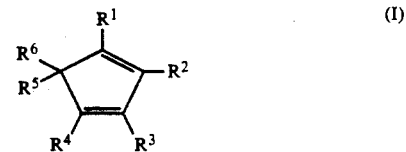

wherein $R^1$, $R^2$, $R^3$, $R^4$, $R^5$ and $R^6$ each independently represent hydrogen, an alkyl group having 1 to 10 carbon atoms, which may have a substituent, an alicyclic group having 5 to 6 carbon atoms, an alkoxyl group having 1 to 6 carbon atoms, which may have a substituent, a halogen, an acyl group, a hydroxyl group, an aryloxy group, an aryl group which may have a substituent, an allyl group, or an aldehyde group.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Referring now to the accompanying drawings, the present invention will be explained in detail.

Figure 1:
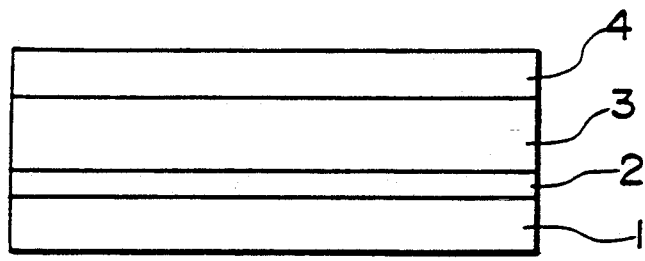
FIG. 1 is a schematic cross-sectional view of an example of an electroluminescence device according to the present invention.

FIG. 1 is a schematic cross-sectional view of an example of an electroluminescence device according to the present invention. In this figure, reference numeral 1 designates a substrate made of glass or of a synthetic resin, and reference numeral 2 designates a first (or positive) electrode. The first electrode 2 can be provided on the substrate 1 by depositing in vacuum or sputtering a metal such as gold, platinum or palladium, or providing a thin layer of tin oxide, indium - tin oxide or an organic conductive material on the substrate 1. It is preferable that the electrode 2 be transparent to light of 400 nm or more. Reference numeral 3 designates a luminescence layer made of a thin layer comprising an organic compound having positive-hole-transporting property and a fluorescent organic compound having electron-transporting property. The thickness of the luminescence layer 3 is generally 200 Å to 3000 Å, preferably 400 Å to 1500 Å. The weight ratio of these two organic compounds can be changed from 10/90 to 90/10.

Figure 2:
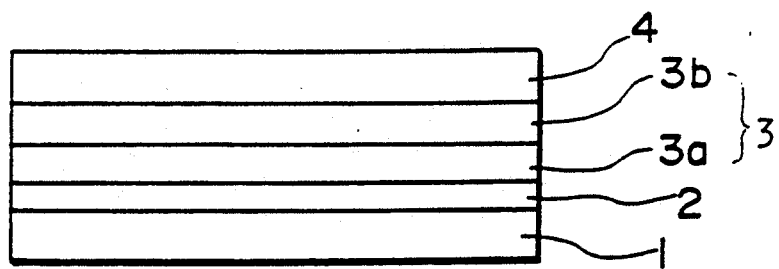
FIG. 2 is a schematic cross-sectional view of another alternative example of an electroluminescence device according to the present invention.

In the present invention, the luminescence layer can also be composed of a first layer 3a comprising an organic compound having positive-hole-transporting property and a second layer 3b comprising a fluorescent organic compound having electron-transporting property as illustrated in FIG. 2.

In FIG. 2, reference numerals 1 and 2 designate the substrate and the first (or positive) electrode, respectively, which are the same as in FIG. 1. Reference numeral 3 designates a luminescence layer composed of a first layer 3a and a second layer 3b. The first layer 3a is a thin layer comprising an organic compound having positive-hole-transporting property. The thickness of this layer is generally 100 Å to 2000 Å, preferably 200 Å to 1000 Å. The second layer 3b is a thin layer comprising a fluorescent organic compound having an electron-transporting property. The thickness of this layer is generally 100 Å to 2000 Å, preferably 200 Å to 1000 Å. The ratio of the two organic compounds contained in these thin layers is also 10/90 to 90/10 on a weight basis. The first layer 3a and the second layer 3b can be overlaid in any order.

It is preferable that those organic compounds having positive-hole-transporting property be amorphous in a solid state and be transparent to light of 400 nm or more. Examples of such organic compounds include triphenyl amine compounds, stilbene derivatives, and oxadiazole derivatives. Specific examples of these compounds are as follows:

[Triphenyl Amine Compounds]

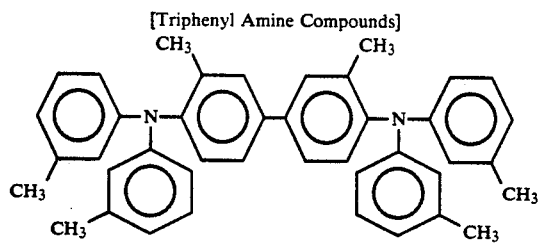

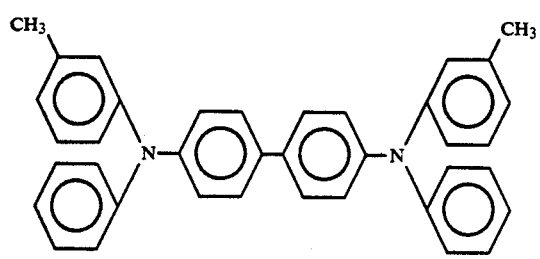

[Stilbene Derivatives]

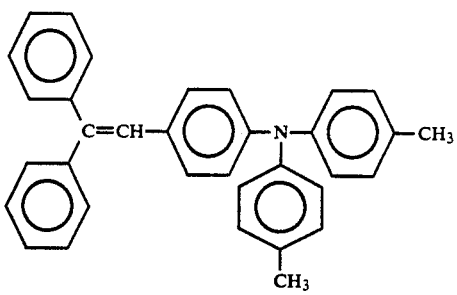

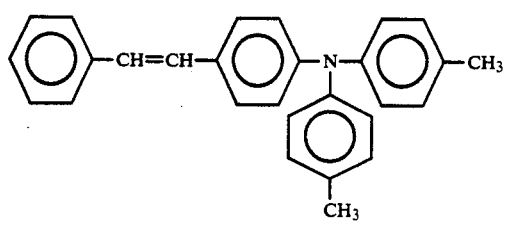

[Oxadiazole Derivative]

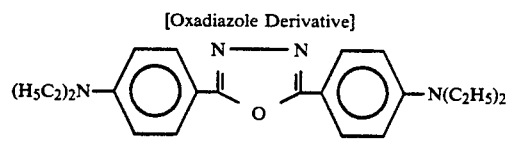

Any solid organic compounds which have electron-transporting property and emit intense fluorescent light can be used as the fluorescent orgainc compound in the present invention. Such organic compounds are not necessary to have high thin-film-forming ability. Examples of such organic compounds are perinone derivatives and quinoline complex derivatives, and their specific examples are as follows:

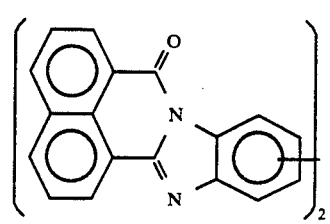 (a)

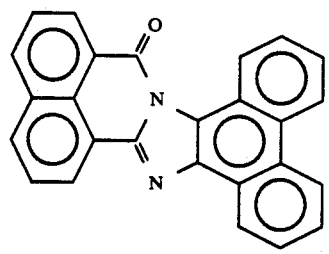 (b)

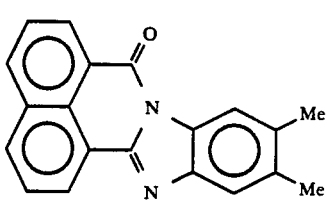 (c)

-continued

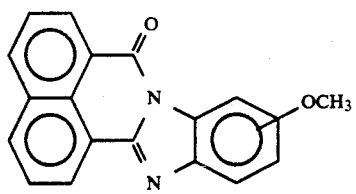

(d)

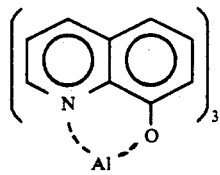

(e)

In addition, when cyclopentadiene derivatives having formula (I) shown below are used as the fluorescent organic compound, the luminescence layer can emit blue fluorescent light which has not been attained so far.

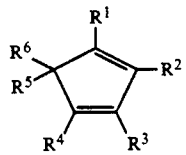

(I)

wherein $R^1$, $R^2$, $R^3$, $R^4$, $R^5$ and $R^6$ each independently represent hydrogen; an alkyl group having 1 to 10 carbon atoms, which may have a substituent such as a phenyl group; an alicyclic group having 5 to 6 carbon atoms such as a cyclopentyl group, a cyclohexyl group and a cyclopentadienyl group; an alkoxyl group having 1 to 6 carbon atoms, which may have a substituent such as a phenyl group; a halogen; and acyl group such as an acetyl group and a benzoyl group; a hydroxyl group; and aryloxy group; an aryl group such as a phenyl group, a biphenyl group and a naphthyl group, which may have a substituent such as an alkyl group having 1 to 4 carbon atoms, an alkoxyl group having 1 to 4 carbon atoms, a halogen and a dialkylamino group; an allyl group; or an aldehyde group.

Specific examples of the cyclopentadiene derivatives are shown in Table 1. However, the present invention is not limited to these cyclopentadiene derivatives.

TABLE 1

| Cyclopentadiene Compound No. | $R^1$ | $R^2$ | $R^3$ | $R^4$ | $R^5$ | $R^6$ |
|---|---|---|---|---|---|---|
| 1 | Ph | Ph | H | H | H | H |
| 2 | Ph | H | Ph | H | H | H |
| 3 | Ph | H | H | Ph | H | H |
| 4 | H | Ph | Ph | H | H | H |
| 5 | Ph | H | H | H | Ph | H |
| 6 | H | Ph | H | H | Ph | H |
| 7 | Ph | Ph | Ph | H | H | H |
| 8 | Ph | Ph | H | Ph | H | H |
| 9 | Ph | Ph | H | H | Ph | H |

TABLE 1-continued
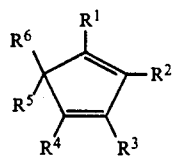
| Cyclopentadiene Compound No. | R¹ | R² | R³ | R⁴ | R⁵ | R⁶ |
|---|---|---|---|---|---|---|
| 10 | Ph | H | Ph | H | Ph | H |
| 11 | H | Ph | Ph | H | Ph | H |
| 12 | Ph | H | H | Ph | Ph | H |
| 13 | Ph | H | H | H | Ph | Ph |
| 14 | H | Ph | H | H | Ph | Ph |
| 15 | Ph | Ph | Ph | Ph | H | H |
| 16 | H | Ph | Ph | Ph | Ph | H |
| 17 | Ph | H | Ph | Ph | Ph | H |
| 18 | Ph | Ph | H | H | Ph | Ph |
| 19 | Ph | H | Ph | H | Ph | Ph |
| 20 | Ph | H | H | Ph | Ph | Ph |
| 21 | Ph | Ph | Ph | Ph | Ph | Ph |
| 22 | Ph | Ph | Ph | Ph | CH₃ | H |
| 23 | Ph | Ph | Ph | Ph | C₂H₅ | H |
| 24 | Ph | Ph | Ph | Ph | C₃H₇(n) | H |
| 25 | Ph | Ph | Ph | Ph | C₃H₇(iso) | H |
| 26 | Ph | Ph | Ph | Ph | C₄H₉(n) | H |

TABLE 1-continued
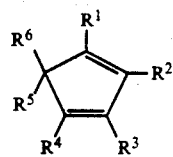
| Cyclopentadiene Compound No. | R¹ | R² | R³ | R⁴ | R⁵ | R⁶ |
|---|---|---|---|---|---|---|
| 27 | Ph | Ph | Ph | Ph | $C_4H_9(iso)$ | H |
| 28 | Ph | Ph | Ph | Ph | $C_4H_9(sec)$ | H |
| 29 | Ph | Ph | Ph | Ph | $C_4H_9(t)$ | H |
| 30 | Ph | Ph | Ph | Ph | $C_5H_{11}(n)$ | H |
| 31 | Ph | Ph | Ph | Ph | $-CH_2C(CH_3)_3$ | H |
| 32 | Ph | Ph | Ph | Ph | $C_8H_{17}(n)$ | H |
| 33 | Ph | Ph | Ph | Ph | $CH_3$ | $CH_3$ |
| 34 | Ph | Ph | Ph | Ph | $CH_3$ | $C_2H_5$ |
| 35 | Ph | Ph | Ph | Ph | $CH_3$ | Ph |
| 36 | Ph | Ph | Ph | Ph | $CH_3$ | $-CH_2$-Ph |
| 37 | Ph | Ph | Ph | Ph | $-CH_2$-Ph | $-CH_2$-Ph |
| 38 | Ph | Ph | Ph | Ph | Cy | H |
| 39 | Ph | Ph | Ph | Ph | Cy | Cy |
| 40 | $CH_3$ | Ph | Ph | Ph | H | H |
| 41 | Ph | $CH_3$ | Ph | Ph | H | H |
| 42 | $CH_3$ | Ph | Ph | Ph | Ph | H |
| 43 | $CH_3$ | Ph | Ph | Ph | Ph | Ph |

TABLE 1-continued

| Cyclopentadiene Compound No. | R¹ | R² | R³ | R⁴ | R⁵ | R⁶ |
|---|---|---|---|---|---|---|
| 44 | –Ph | –Ph | –Ph | –Ph | –Ph | Br |
| 45 | –Ph | –Ph | –Ph | –Ph | –Ph | Cl |
| 46 | –C₆H₄–Ph | H | –Ph | H | H | H |
| 47 | –Ph | –Ph | –Ph | –Ph | Cl | CH₃ |
| 48 | –Ph | –Ph | H | –Ph | –Ph | –OCH₃ |
| 49 | –Ph | –Ph | CH₃ | –Ph | –Ph | –Ph |
| 50 | –Ph | CH₃ | –Ph | –Ph | –Ph | H |
| 51 | –Ph | –Ph | –Ph | –Ph | –Ph | H |
| 52 | H | –C₆H₄–CH₃ | –C₆H₄–CH₃ | H | –Ph | H |
| 53 | –Ph | H | H | –C₆H₄–CH₃ | H | H |
| 54 | –CO–Ph | –Ph | H | –CO–Ph | –CO–Ph | H |
| 55 | –OH | –Ph | –OH | –Ph | –Ph | H |
| 56 | –Ph | –Ph | –OH | –Ph | –Ph | –Ph |
| 57 | –Ph | –Ph | –Ph | –Ph | –OH | –CO–Ph |
| 58 | –Ph | –Ph | –Ph | –Ph | –OH | –CH₂–Ph |
| 59 | –Ph | –Ph | –Ph | –Ph | –CH₂–Ph | –O–Ph |
| 60 | –Ph | –Ph | –Ph | –Ph | –CH₂–Ph | –CH₂C(CH₃)₃ |

TABLE 1-continued

Structure: cyclopentadiene with substituents R¹, R², R³, R⁴ on ring carbons and R⁵, R⁶ on the sp3 carbon.

| Cyclopentadiene Compound No. | R¹ | R² | R³ | R⁴ | R⁵ | R⁶ |
|---|---|---|---|---|---|---|
| 61 | Ph | —CH₂CH₂—Ph | Ph | Ph | Ph | —CH₂—Ph |
| 62 | Ph | Ph | Ph | Ph | —CH₂—Ph | —CH₂CH₂—Ph |
| 63 | 4-Cl-C₆H₄ | Ph | Ph | 4-Cl-C₆H₄ | H | H |
| 64 | Ph | 4-Cl-C₆H₄ | 4-Cl-C₆H₄ | Ph | H | H |
| 65 | 4-OCH₃-C₆H₄ | Ph | Ph | 4-OCH₃-C₆H₄ | H | H |
| 66 | Ph | 4-OCH₃-C₆H₄ | 4-OCH₃-C₆H₄ | Ph | H | H |
| 67 | 4-Cl-C₆H₄ | Ph | Ph | Ph | H | H |
| 68 | Ph | 4-Cl-C₆H₄ | Ph | Ph | H | H |
| 69 | Ph | 4-CH₃-C₆H₄ | 4-CH₃-C₆H₄ | Ph | H | H |
| 70 | Ph | Ph | Ph | Ph | —CH₂CH₂—Ph | H |
| 71 | Ph | Ph | Ph | Ph | 2-CH₃-C₆H₄ | H |
| 72 | Ph | Ph | Ph | 4-CH₃-C₆H₄ | H | H |
| 73 | Ph | Ph | 4-CH₃-C₆H₄ | Ph | H | H |
| 74 | Ph | Ph | Ph | Ph | —CH₂CHO | H |
| 75 | Ph | Ph | Ph | Ph | —CH₂CH=CH₂ | —OH |
| 76 | Ph | Ph | Ph | Ph | cyclopentenyl | —OH |
| 77 | Ph | —C₆H₄—N(CH₃)₂ | Ph | Ph | CH₂ | —OH |

TABLE 1-continued

Cyclopentadiene structure with substituents R¹, R², R³, R⁴, R⁵, R⁶

| Cyclopentadiene Compound No. | R¹ | R² | R³ | R⁴ | R⁵ | R⁶ |
|---|---|---|---|---|---|---|
| 78 | Ph | Ph | Ph | Ph | -C₆H₄-N(CH₃)₂ | —OH |
| 79 | Ph | -C₆H₄-N(CH₃)₂ | Ph | Ph | Ph | —OH |
| 80 | CH₃ | Ph | Ph | Ph | -C₆H₄-OCH₃ | —OH |
| 81 | Ph | -C₆H₄-OCH₃ | Ph | Ph | CH₃ | —OH |
| 82 | Ph | Ph | -C₆H₄-CH₃ | Ph | CH₃ | —OH |
| 83 | -C₆H₄-OCH₃ | -C₆H₄-OCH₃ | H | H | H | H |
| 84 | -C₆H₄-OCH₃ | H | -C₆H₄-OCH₃ | H | H | H |
| 85 | CH₃ | Ph | Ph | CH₃ | H | H |
| 86 | CH₃ | Ph | Ph | Ph | CH₃ | H |
| 87 | Ph | H | Ph | Ph | -C₆H₄-CH₃ | Ph |
| 88 | -C₆H₄-CH₃ | Ph | Ph | Ph | Ph | H |
| 89 | Ph | Ph | Ph | Ph | —OCH₂-Ph | —OCH₂-Ph |
| 90 | -C₆H₄-C₆H₅ | -C₆H₄-C₆H₅ | Ph | Ph | Ph | H |
| 91 | -C₆H₄-C₆H₅ | -C₆H₄-C₆H₅ | Ph | Ph | Ph | Br |
| 92 | -C₆H₄-C₆H₅ | Ph | Ph | -C₆H₄-C₆H₅ | Ph | H |
| 93 | -C₆H₄-C₆H₅ | Ph | Ph | -C₆H₄-C₆H₅ | Ph | Br |
| 94 | -C₆H₄-C₆H₅ | -C₆H₄-C₆H₅ | Ph | Ph | Ph | CH₃ |

TABLE 1-continued

Cyclopentadiene structure with R¹, R², R³, R⁴, R⁵, R⁶ substituents:

R⁶, R⁵ on sp³ carbon; R¹, R², R³, R⁴ on the ring carbons.

| Cyclopentadiene Compound No. | R¹ | R² | R³ | R⁴ | R⁵ | R⁶ |
|---|---|---|---|---|---|---|
| 95 | —Ph | —Ph—Ph | —Ph—Ph | —Ph | H | H |
| 96 | —Ph—Cl | —Ph—Cl | —Ph—Cl | —Ph—Cl | —Ph—Cl | H |
| 97 | —Ph—OCH₃ | —Ph—OCH₃ | —Ph—OCH₃ | —Ph—OCH₃ | —Ph—OCH₃ | H |
| 98 | —Ph—CH₃ | —Ph—CH₃ | —Ph—CH₃ | —Ph—CH₃ | —Ph—CH₃ | H |
| 99 | Br | —Ph | —Ph | —Ph | H | H |
| 100 | —Ph | —Ph | —Ph | H | —cyclopentadienyl(H) | H |
| 101 | —Ph | —COCH₃ | —COCH₃ | —Ph | H | H |
| 102 | —Ph—Ph | —Ph—Ph | —Ph—Ph | —Ph—Ph | —Ph—Ph | H |
| 103 | —naphthyl | —Ph | —Ph | —naphthyl | H | H |
| 104 | —naphthyl | —Ph | —Ph | —naphthyl | H | H |
| 105 | —Ph | —naphthyl | —naphthyl | —Ph | H | H |
| 106 | —naphthyl | —naphthyl | —Ph | —Ph | H | H |

The luminescence layer can be formed by any conventional method such as vacuum deposition, coating method and melting method.

When vacuum deposition is employed to form the luminescence layer, for instance, the following methods can be employed.

(1) An organic compound having positive-hole-transporting property and a fluorescent organic compound are simultaneously deposited on a substrate by using two different evaporating sources which can heat the compounds to predetermined temperatures respectively to control the deposition speed of each compound independently.

When the deposition speed of each compound is varied while the deposition is conducted, a luminescence layer having a different composition in the direction of the thickness thereof can be obtained.

(2) The two organic compounds are mixed in advance, and the mixture is deposited on the substrate by using one evaporating source.

In the case where the coating method, in particular a wet-type film forming method, is employed to form the luminescence layer, the following steps are taken.

A mixture of the organic compound having positive-hole-transporting property and the fluorescent organic compound is dissolved or dispersed, if necessary, together with a binder resin, in a solvent such as dichloromethane to obtain a solution or a dispersion with a concentration of 1.0 to 6.0 wt %. The resulting solution or dispersion is spin-coated onto the substrate. The thickness and the characteristics of the luminescence layer can be controlled by changing the manner for pulling up the substrate from the solution or the dispersion.

In FIGS. 1 and 2, reference numeral 4 designates a second (or negative) electrode. The second electrode 4 can be provided by depositing metals or organic electroconductive materials by vacuum deposition on the luminescence layer 3. It is preferable that those metals have a low work function such as Mg, Al, Ag and In for use in the present invention.

In order to improve the durability and the light-emitting efficiency of the electroluminescence device of the present invention, one or more layers made of organic materials may be interposed between the first electrode and the luminescence layer and/or between the second electrode and the luminescence layer.

The luminescence layer of the electroluminescence device according to the present invention comprises the organic compound having positive-hole-transporting property and the fluorescent organic compound, or composed of a first thin layer comprising the organic compound having positive-hole-transporting property and a second thin layer comprising the fluorescent organic compound. Therefore, the electroluminescence device of the present invention can easily be produced, can emit light with high luminous intensity, and has improved durability.

Furthermore, when the luminescence layer comprises the previously mentioned cyclopentadine derivative having formula (I) as the fluorescent organic compound, the electroluminescence device can emit blue light with high luminous intensity, and its light-emitting characteristics last for a prolonged period of time.

Other features of this invention will become apparent in the course of the following description of exemplary embodiments, which are given for illustration of the invention and are not intended to be limiting thereof.

EXAMPLE 1-1

A glass plate deposited with indium - tin oxide ITO) (made by HOYA Corporation), which is referred to as the ITO glass substrate and serves as a first (positive) electrode, was washed with a neutral detergent, and then subjected to ultrasonic cleaning in ethanol for approximately 10 minutes. The ITO glass substrate thus cleaned was dipped in boiled ethanol for about one minute, and then dried in a blowing air.

N,N'-diphenyl-N,N'-(3-methylphenyl)-1,1'-biphenyl-4,4'-diamine (hereinafter referred to as TPD) which is an o compound having positive-hole-transporting property, and a perinone derivative having formula shown below, which is a fluorescent organic compound, were separately placed in tantalum boats serving as evaporation sources. These compounds in the evaporation sources were heated to respective temperatures predetermined by a resistance heater to control the deposition speed of each compound. Thus, the two organic compounds were simultaneously deposited on the glass plate to form a luminescence layer.

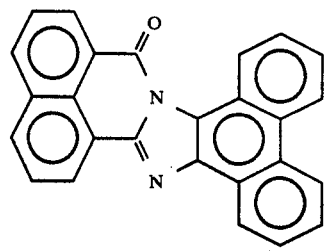

More specifically, the temperature of the tantalum boat charged with the TPD and that of another tantalum boat serving as another evaporation source charged with the perinone derivative were maintained at 200° C. and 250° C., respectively, by a temperature controller to adjust the deposition speed of each compound 2 Å/second. Thus the total deposition speed of the compounds was set at 4 Å/second. The vacuum degree at the time of the deposition was $0.7 \times 10^{-6}$ Torr, and the temperature of the ITO glass substrate was 20° C. The thickness of the luminescence layer thus formed on the ITO glass substrate was 1500 Å.

An Mg-Ag (second) electrode with an area of 0.1 $cm^2$ and a thickness of 1500 Å was formed on the luminescence layer by vacuum deposition, whereby electroluminescence device No. 1-1 according to the present invention was obtained.

The device thus obtained emitted orange light having a light intensity peak at 580 nm when a positive bias voltage was applied to the ITO glass substrate side. The device emitted light with a luminous intensity of 500 cd/m2 when an electromotive force of 20 V with a current density of 100 $mA/cm^2$ was applied thereto. The device functioned normally in the dried air. Furthermore, the luminous intensity of 50 cd/$m^2$ emitted by the device was not decreased even when the device was operated for 40 hours with application of an electric current with a current density of 10 $mA/cm^2$.

EXAMPLE 1-2

The procedure in Example 1-1 was repeated except that the fluorescent organic compound used in Example 1-1 was replaced by a chelating compound having the following formula, and the temperature of the boat charged with the chelating compound was maintained at 270° C. to adjust the deposition speed to 2 Å/s and the total deposition speed to 4 Å/s, so that a luminescence layer having a thickness of 1000 Å was formed on the ITO glass plate, whereby electroluminescence device No. 1-2 according to the present invention was obtained.

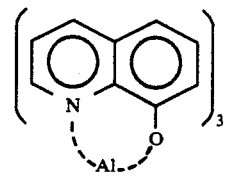

The device thus obtained emitted green light having a light intensity peak at 520 nm. This device emitted light with a luminous intensity of 500 cd/$m^2$ when an electromotive force of 20 V with a current density of 100 $mA/cm^2$ was applied thereto.

EXAMPLE 1-3

The procedure in Example 1-1 was repeated except that the fluorescent organic compound used in Example 1-1 was replaced by a stilbene derivative having the following formula, and the temperature of the boat charged with the stilbene compound was maintained at 160° C. to adjust the deposition speed to 2 Å/second and the total deposition speed to 4 Å/second, so that a luminescence layer having a thickness of 1000 Å was formed on the ITO, whereby electroluminescence device No. 1-3 according to the present invention was obtained.

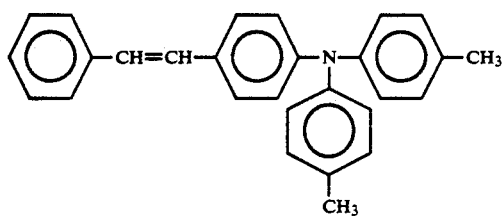

The device thus obtained emitted orange light having a light intensity peak at 580 nm. This device emitted light with a luminous intensity of 500 cd/m$^2$ when an electromotive force of 20 V with a current density of 100 mA/cm$^2$ was applied thereto.

EXAMPLE 1-4

The procedure in Example 1-1 was repeated except that the fluorescent organic compound used in Example 1-1 was replaced by a perinone derivative having the following formula, and the temperature of the boat charged with the perinone derivative was maintained at 210° C. to adjust the deposition speed to 2 Å/second and the total deposition speed to 4 Å/second, so that a luminescence layer having a thickness of 1000 Å was formed on the ITO glass plate, whereby electroluminescence device No. 1-4 according to the present invention was obtained.

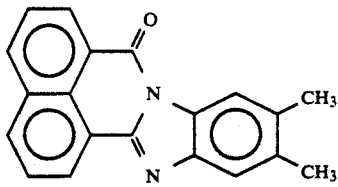

The device thus obtained emitted yellow light having a light intensity peak at 550 nm. This device emitted light with a luminous intensity of 50 cd/m$^2$ when an electromotive force of 19 V with a current density of 100 mA/cm$^2$ was applied thereto.

EXAMPLE 1-5

The same organic compound having positive-hole-transporting property as that employed in Example 1-1, that is, TPD, was deposited on an ITO plate by vacuum deposition to form a positive-hole-transporting layer with a thickness of 500 Å. During this deposition, the temperature of a boat charged with the TPD was maintained at 190° C. to control its deposition speed to 2 Å/second.

The same fluorescent organic compound as that employed in Example 1-4 was then deposited on the positive-hole-transporting layer by vacuum deposition to form an electron-transporting layer with a thickness of 500 Å. In the above, the temperature of a boat charged with the fluorescent organic compound was maintained at 210° C. to control its deposition speed to 2 Å/second.

Thus, a luminescence layer composed of the positive-hole-transporting layer and the electron transporting layer was formed on the ITO plate.

Thereafter, an Mg-Ag (second) electrode with a thickness of 1500 Å was formed on the luminescence layer by vacuum deposition, whereby electroluminescence layer No. 1-5 according to the present invention was prepared.

The device thus prepared emitted yellow light having a light intensity peak at 550 nm. This device emitted light with a luminous intensity of 0.5 cd/m$^2$ when an electromotive force of 14 V with a current density of 100 mA/cm$^2$ was applied thereto.

EXAMPLE 2-1

A glass plate deposited with indium - tin oxide (ITO) (made by HOYA Corporation), which is referred to as the ITO substrate and serves as a first (positive) electrode, was washed with a neutral detergent, and then subjected to ultrasonic cleaning in ethanol for approximately 10 minutes. The ITO glass substrate thus cleaned was dipped in boiled ethanol for about one minute, and then dried in a blowing air.

N,N'-diphenyl-N,N'-(3-methylphenyl)-1,1'-biphenyl-4,4'-diamine (TPD) which is an organic compound having posit hole-transporting property, was placed in a tantalum boat serving as an evaporation source. The TPD in the evaporation source was heated by a resistance heater to a predetermined temperature and its deposition speed was controlled. Thus, the TPD was deposited on the ITO glass substrate to form a positive-hole-transporting layer.

More specifically, the temperature of the tantalum boat charged with the TPD was maintained at 200° C. by a temperature controller to adjust the deposition speed of the TPD to 2 Å/second. The vacuum degree at the time of the vacuum deposition was $0.7 \times 10^{-6}$ Torr, and the temperature of the ITO glass substrate was 20° C. The thickness of the positive-hole-transporting layer formed on the ITO glass substrate was 500 Å.

1,2,3,4-tetraphenyl-1,3-cyclopentadine (Compound No. 15 shown in Table 1) which is a fluorescent organic compound was placed in a tantalum boat serving as an evaporating source, and the compound was heated to a predetermined temperature to control its deposition speed. Thus, Compound No. 15 was deposited on the positive-hole-transporting layer to form a layer of the fluorescent organic compound under the condition that the temperature of the tantalum boat charged with the compound was maintained at 180° C. to adjust the deposition speed to 2 Å/second.

On the layer of the fluorescent organic compound, an Mg-Ag (second) electrode with an area of 0.1 cm$^2$ and a thickness of 1500 Å was formed by vacuum deposition, whereby electroluminescence device No. 2-1 according to the present invention was obtained.

The device thus obtained emitted blue light having a light intensity peak at 460 nm when a positive bias voltage was applied to the ITO glass substrate side. Furthermore, the device emitted light with a luminous intensity of 100 cd/m$^2$ when an electromotive force of 22 V with a current density of 100 mA/cm² was applied thereto. This device functioned normally in the dried air.

EXAMPLE 2-2

The procedure in Example 2-1 was repeated except that the fluorescent organic compound used in Example 2-1 was replaced by 1,2,3,4,5-pentaphenyl-1,3-cyclopentadiene (Compound No. 51 shown in Table 1) and the temperature of the boat charged with this compound was maintained at 270° C., whereby electroluminescence device No. 2-2 according to the present invention was prepared.

The device emitted blue light having a light intensity peak at 470 nm when a positive bias voltage was applied to the ITO glass substrate side. Furthermore, the device emitted light with a luminous intensity of 500 cd/m² when an electromotive force of 25 V with a current density of 100 mA/cm² was applied thereto. The device functioned normally in the dried air.

COMPARATIVE EXAMPLE

The procedure in Example 2-1 was repeated except that the fluorescent organic compound used in Example 2-1 was replaced by a conventionally known compound 1,1,4,4-tetraphenyl-1,3-butadiene having the following formula, and the temperature of the boat charged with this compound was maintained at 160° C., whereby a comparative electroluminescence device was prepared.

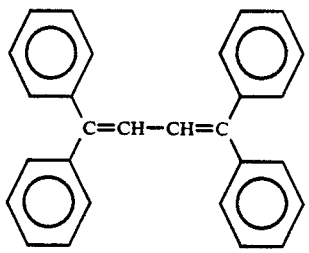

The device emitted blue light having a light intensity peak at 460 nm when a positive bias voltage was applied to the ITO glass substrate side. However, the luminous intensity of light emitted by the device was as low as 0.2 cd/m² when an electromotive force of 18 V with a current density of 100 mA/cm² was applied thereto.

EXAMPLE 3-1

A glass plate deposited with indium - tin oxide (ITO) (made by HOYA Corporation), which is referred to as the ITO glass substrate and serves as a first (positive) electrode, was washed with a neutral detergent, and then subjected to ultrasonic cleaning in ethanol for approximately 10 minutes. The ITO glass substrate thus cleaned wa dipped in boiled ethanol for about one minute, and then dried in a blowing air.

An equimolar mixture of polyvinylcarbazole, which is an electron-donating organic compound having positive-hole-transporting property, and a perinone derivative having the following formula (II), which is a fluorescent organic compound, was dissolved in dichloromethane to obtain a dichloromethane solution with a concentration of approximately 4.0 wt %.

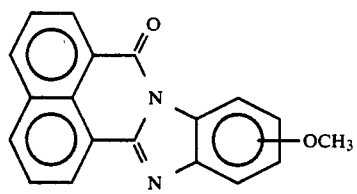

While rotating the ITO glass substrate at a speed of 1500 rpm, the above-obtained solution was spin-coated onto the surface of the ITO glass substrate to form a luminescence layer with a thickness of approximately 1000 Å thereon.

An Mg-Ag (second) electrode with an area of 0.1 cm² and a thickness of 1500 Å was formed on the luminescence layer by vacuum deposition, whereby electroluminescence device No. 3-1 according to the present invention was obtained.

The device thus obtained emitted yellow light having a light intensity peak at 550 nm when a positive bias voltage was applied to the ITO glass substrate side. Furthermore, the device emitted light with a luminous intensity of 50 cd/m² when an electromotive force of 60 V with a current density of 100 mA/cm² was applied thereto. The device functioned normally in the dried air.

EXAMPLE 3-2

The procedure in Example 3-1 was repeated except that the perinone derivative (II) serving as a fluorescent organic compound used in Example 3-1 was replaced by a chelating compound having the following formula, whereby electro-luminescence device 3-2 according to the present invention was prepared.

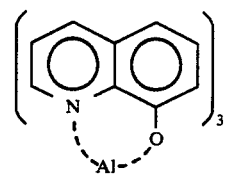

The device thus obtained emitted yellow light having a light intensity peak at 520 nm. Furthermore, the device emitted light with a luminous intensity of 120 cd/m² when an electromotive force of 66 V with a current density of 100 mA/cm² was applied thereto.

EXAMPLE 3-3

The procedure in Example 3-1 was repeated except that the perinone derivative (II) serving as a fluorescent organic compound used in Example 3-1 was replaced by a cyclopentadiene derivative having the following formula, whereby electroluminescence device 3-3 according to the present invention was prepared.

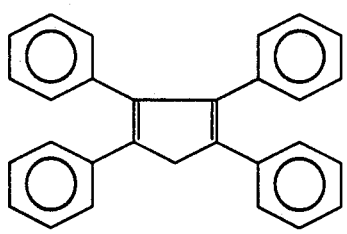

The device thus obtained emitted blue light having a light intensity peak at 460 nm when a positive bias voltage was applied the ITO glass substrate side. Furthermore, the device emitted light with a luminous intensity of 105 cd/m² when an electromotive force of 72 V with a current density of 100 mA/cm² was applied thereto.

EXAMPLE 3-4

The same ITO glass substrate as that employed in Example 3-1 was prepared.

N,N'-diphenyl-N,N'-(3-methylphenyl)-1,1'-biphenyl-4,4'-diamine serving as an electron-donating organic compound having positive-hole-transporting property, the perinone derivative (II) used in Example 3-1 serving as a fluorescent organic compound, and Bisphenol A - polycarbonate serving as a binder resin were dispersed in a weight ratio of 4:4:1 and dissolved in dichloromethane.

While rotating the ITO glass substrate at a speed of 1500 rpm, the above-obtained solution was spin-coated onto luminescence layer with a thickness of approximately 1000 Å.

An Mg-Ag (second) electrode with an area of 0.1 cm² and a thickness of 1500 Å was formed on the luminescence layer by vacuum deposition, whereby electroluminescence device No. 3-4 according to the present invention was obtained.

The device thus obtained emitted yellow light having a light intensity peak at 550 nm. Furthermore, the device emitted light with a luminous intensity of 75 cd/m² when an electromotive force of 55 V with a current density of 100 mA/cm² was applied thereto.

What is claimed is:

1. An electroluminescence device comprising:

a positive electrode;

a luminescence layer in direct contact with said positive electrode, said luminescence layer consisting of an organic compound having positive-hole-transporting property selected from the group consisting of

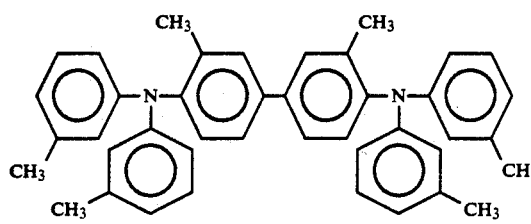

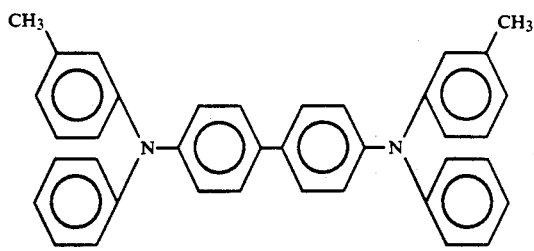

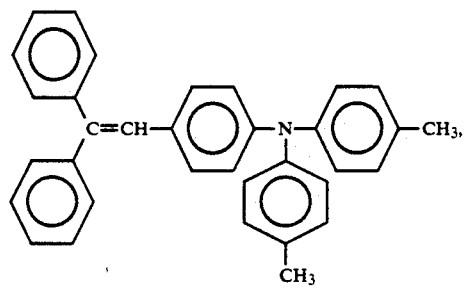

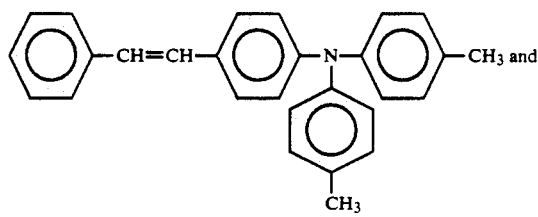

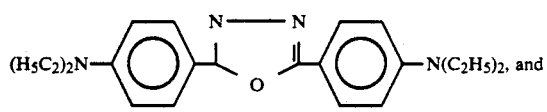

a fluorescent orgainc compound having electron-transporting property selected from the group consisting of

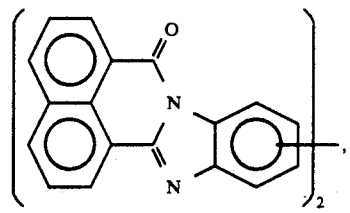

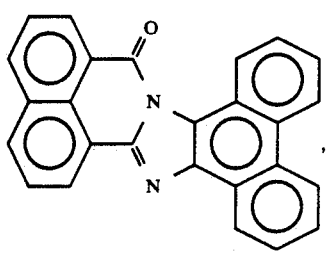

-continued

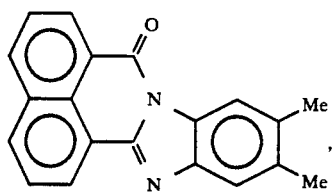

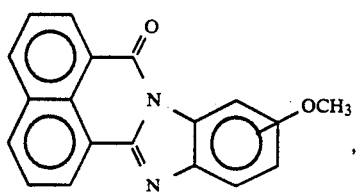

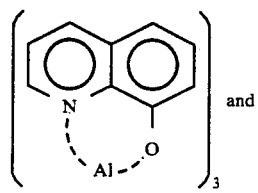

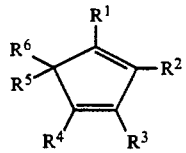

wherein $R^1$, $R^2$, $R^3$, $R^4$, $R^5$ and $R^6$ each independently represent hydrogen, alkyl of 1 to 10 carbon atoms which may have a substituent, alicyclic of 5 to 6 carbon atoms, alkoxyl of 1 to 6 carbon atoms which may have a substituent, halogen, acyl, hydroxyl, aryloxy, aryl which may have a substituent, allyl or aldehyde; and a negative electrode in direct contact with said luminescence layer.

2. The device as claimed in claim 1, wherein sid alkyl is phenyl substituted.

3. The device as claimed in claim 1, wherein said alicyclic is cyclopentyl or cyclohexyl.

4. The device as claimed in claim 1, wherein said alicyclic is cyclopentadienyl.

5. The device as claimed in claim 1, wherein said alkoxyl is phenyl substituted.

6. The device as claimed in claim 1, wherein said acyl is acetyl or benzoyl.

7. The device as claimed in claim 1, wherein said aryl is phenyl, biphenyl or naphthyl.

8. The device as claimed in claim 1, wherein said aryl group is substituted by alkyl of 1 to 4 carbons, alkoxyl of 1 to 4 carbons, halogen or dialkylamino.

9. The device as claimed in claim 1, wherein said luminescence layer has a thickness of 200 Å to 3000 Å.

10. The device as claimed in claim 1, wherein a weight ratio of said organic compound having positive-hole-transporting property to said fluorescent organic compound in said luminescence layer is in the range of 10/90 to 90.10.

11. The device as claimed in claim 1, wherein said positive electrode comprises a material selected from the group consisting of gold, platinum, palladium, tin oxide, indium-tin oxide and an organic electroconductive material.

12. The device as claimed in claim 1, wherein said positive electrode is transparent to light having a wavelength of 400 nm or more.

13. The device as claimed in claim 1, wherein said negative electrode comprises a material selected from the group consisting of Mg, Al, Ag and In.

14. An electroluminescence device comprising:
a positive electrode;
a luminescence layer comprising
a first layer in direct contact with said positive electrode, said first layer consisting of an organic compound having positive-hole-transporting property selected from the group consisting of

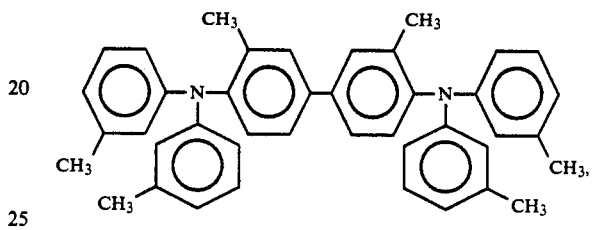

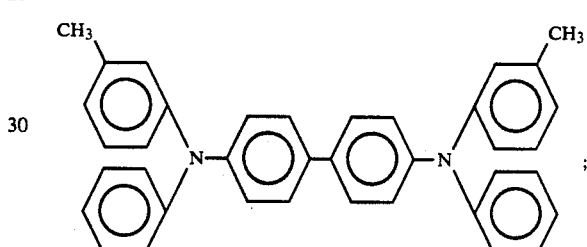

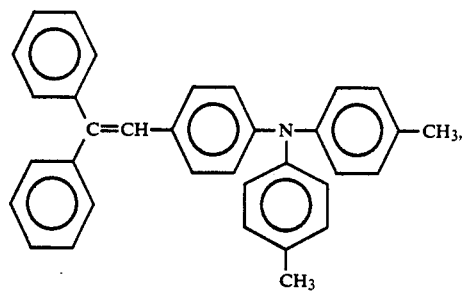

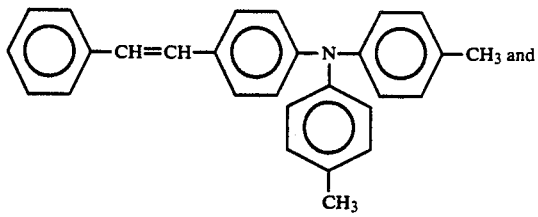

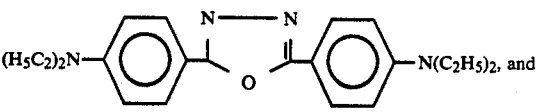

a second layer in direct contact with said first layer, said second layer consisting of a fluorescent organic compound having electron-transporting property selected from the group consisting of

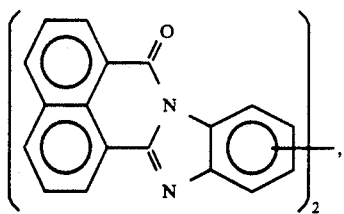
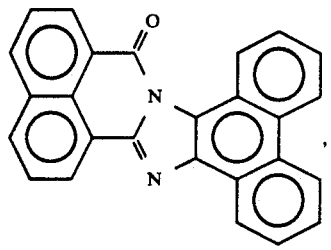
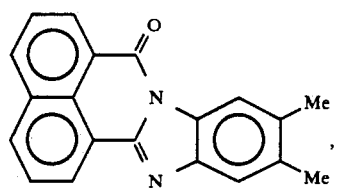
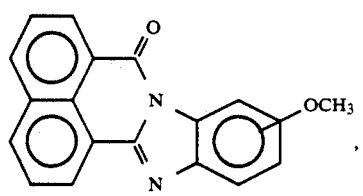
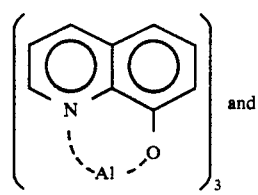

-continued

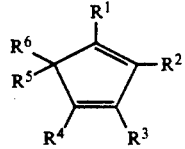

wherein $R^1$, $R^2$, $R^3$, $R^4$, $R^5$ and $R^6$ each independently represent hydrogen, alkyl of 1 to 10 carbon atoms which may have a substituent, alicyclic of 5 to 6 carbon atoms, alkoxyl of 1 to 6 carbon atoms which may have a substituent, halogen, acyl, hydroxyl, aryloxy, aryl which may have a substituent, allyl or aldehyde; and a negative electrode in direct contact with said second layer.

15. The device as claimed in claim 14, wherein said alkyl is phenyl substituted.

16. The device as claimed in claim 14, wherein said alicyclic is cyclopentyl or cyclohexyl.

17. The device as claimed in claim 14, wherein said alicyclic is cyclopentadienyl.

18. The device as claimed in claim 14, wherein said alkoxy is phenyl substituted.

19. The device as claimed in claim 14, wherein said acyl group is acetyl or benzoyl.

20. The device as claimed in claim 14, wherein said aryl is phenyl, biphenyl or naphthyl.

21. The device as claimed in claim 14, wherein said aryl group is substituted by alkyl of 1 to 4 carbons, alkoxyl of 1 to 4 carbons, halogen or dialkylamino.

22. The device as claimed in claim 14, wherein said first layer has a thickness of 100 Å to 2000 Å.

23. The device as claimed in claim 14, wherein said second layer has a thickness in the range of 100 Å to 2000 Å.

24. The device as claimed in claim 14, wherein said positive electrode comprises a material selected from the group consisting of gold, platinum, palladium, tin oxide, indium-tin oxide and an organic electroconductive material.

25. The device as claimed in claim 14, wherein said positive electrode is transparent to light having a wavelength of 400 nm or more.

26. The device as claimed in claim 14, wherein said negative electrode comprises a material selected from the group consisting of Mg, Al, Ag and In.

* * * * *

UNITED STATES PATENT AND TRADEMARK OFFICE
CERTIFICATE OF CORRECTION

PATENT NO. : 5,085,946

DATED : FEBRUARY 4, 1992

INVENTOR(S) : SHOGO SAITO ET AL

It is certified that error appears in the above-identified patent and that said Letters Patent is hereby corrected as shown below:

Column 1, line 50, delete "electro-luminescence", insert --electroluminescence--;
         line 61, delete "electro-luminescence", insert --electroluminescence--.

Column 19, line 48, before "ITO)", insert --(--;
          line 58, after "an", delete "o", insert --organic--.

Column 20, line 18, after "compound", insert --to--;
          line 34, delete "cd/m2", insert --cd/m$^2$--.

Column 22, line 32, delete "posit", insert --positive--.

Column 23, line 59, delete "wa", insert --was--.

Column 26, Claim 1, line 42, delete "orgainc", insert --organic--.

Column 27, Claim 2, line 42, delete "sid", insert --said--.

Signed and Sealed this

Sixteenth Day of November, 1993

Attest:

BRUCE LEHMAN

*Attesting Officer*     *Commissioner of Patents and Trademarks*